(12) United States Patent
Alakuijala et al.

(10) Patent No.: US 10,019,378 B1
(45) Date of Patent: Jul. 10, 2018

(54) ADDRESSING RECENT STRINGS WITH RING BUFFER

(71) Applicant: GOOGLE INC., Mountain View, CA (US)

(72) Inventors: Jyrki Antero Alakuijala, Adliswil (CH); Zoltan Szabadka, Adliswil (CH)

(73) Assignee: GOOGLE LLC, Mountain View, CA (US)

( * ) Notice: Subject to any disclaimer, the term of this patent is extended or adjusted under 35 U.S.C. 154(b) by 854 days.

(21) Appl. No.: 14/510,500

(22) Filed: Oct. 9, 2014

(51) Int. Cl.
*G06F 12/1018* (2016.01)
*G11C 21/00* (2006.01)

(52) U.S. Cl.
CPC .......... *G06F 12/1018* (2013.01); *G11C 21/00* (2013.01); *G06F 2212/401* (2013.01)

(58) Field of Classification Search
None
See application file for complete search history.

(56) References Cited

U.S. PATENT DOCUMENTS

| | | | | |
|---|---|---|---|---|
| 5,281,967 A * | 1/1994 | Jung | ................... | H03M 7/3086 341/51 |
| 5,923,900 A * | 7/1999 | Soell | ........................ | G06F 7/74 710/40 |
| 2002/0140583 A1 * | 10/2002 | Parenteau | ........... | H03M 7/3084 341/51 |
| 2009/0006510 A1 * | 1/2009 | Laker | .................. | H03M 7/3086 708/203 |
| 2009/0210586 A1 * | 8/2009 | Tanabe | .................. | H04L 45/745 710/52 |
| 2010/0306294 A1 * | 12/2010 | Schneider | ............. | H04L 9/0643 708/250 |

OTHER PUBLICATIONS

"Circular Buffer", From Wikipedia, the free encyclopedia, retrieved on Jul. 31, 2014 from http://en.wikipedia.org/wiki/Circular_buffer, 11 pages.
"Compression Algorithm", www.gzip.org/algorithm.txt, Jul. 25, 2014, 4 pages.
"Lempel-Ziv-Markov Chain Algorithm", From Wikipedia, the free encyclopedia, retrieved on Jul. 31, 2014, 19 pages.

* cited by examiner

*Primary Examiner* — Kevin Bates
*Assistant Examiner* — Lesa Kennedy
(74) *Attorney, Agent, or Firm* — Brake Hughes Bellermann LLP (57) ABSTRACT

A non-transitory computer-readable storage medium may include instructions stored thereon. When executed by at least one processor, the instructions may be configured to cause a computing system to compress data by storing positions of strings that hash to a same hash value in a ring buffer, and retrieving the ring buffer in a single memory operation to determine a longest matching string that hashes to the same hash value.

28 Claims, 8 Drawing Sheets

ADDRESSING RECENT STRINGS WITH RING BUFFER

TECHNICAL FIELD

This description relates to compressing data.

BACKGROUND

Data may be transmitted between, and/or stored within, computing systems. Large amounts of data may utilize large amounts of communication and/or storage resources.

SUMMARY

A data stream may be compressed by encoding strings of data as references to previous occurrences of the same strings of data. Rather than search all of the preceding symbols for a match, positions of strings beginning with a same first n characters, such as first three characters, or positions of strings for which the first n characters hash to a same value, may be stored. These strings may be checked for a longest match to the current string to be matched. To reduce the latency in retrieving the positions of the strings from memory, the positions may be stored in a single contiguous block of memory. The single contiguous block of memory storing the positions may be retrieved with less latency than retrieving the positions from noncontiguous, disparate locations in memory. The single contiguous block of memory storing the positions of the potentially matching strings may be used as a ring buffer, which is updated by writing a position of a most recent string over a position of a least recent string.

According to an example implementation, a non-transitory computer-readable storage medium may include instructions stored thereon. When executed by at least one processor, the instructions may be configured to cause a computing system to compress data by storing positions of strings that hash to a same hash value in a ring buffer, and retrieving the ring buffer in a single memory operation to determine a longest matching string that hashes to the same hash value.

According to an example implementation, a non-transitory computer-readable storage medium may include instructions stored thereon. When executed by at least one processor, the instructions may be configured to cause a computing system to compress data by performing a hash function on a first n symbols of a string to be matched to obtain a hash value, retrieving a plurality of positions included in a ring buffer by indexing the ring buffer based on the hash value, the plurality of positions including at least a first position of a most recent string hashing to the hash value and a second position of a next most recent string hashing to the hash value, retrieving the most recent string hashing to the hash value from memory based on the first position, determining a first match length between the string to be matched and the most recent string hashing to the hash value, retrieving the next recent string hashing to the hash value from memory based on the second position, and determining a second match length between the string to be matched and the next most recent string hashing to the hash value.

According to an example implementation, a non-transitory computer-readable storage medium may include instructions stored thereon. When executed by at least one processor, the instructions may be configured to cause a computing system retrieve a plurality of positions as a single contiguous block of memory, the single contiguous block of memory being identified based on a hash value of a string to be matched, the plurality of positions referencing strings that hash to the hash value of the string to be matched and are non-contiguous, sequentially retrieving strings addressed by the plurality of positions and determining match lengths of the string to be matched to the retrieved strings, and encoding the string to be matched by a reference to a longest matching string from the sequentially retrieved strings.

According to an example implementation, a computing system may include means for storing positions of strings that hash to a same hash value in a ring buffer, and means for retrieving the ring buffer in a single memory operation to determine a longest matching string that hashes to the same hash value.

According to an example implementation, a computing system may include means for performing a hash function on a first n symbols of a string to be matched to obtain a hash value, means for retrieving a plurality of positions included in a ring buffer by indexing the ring buffer based on the hash value, the plurality of positions including at least a first position of a most recent string hashing to the hash value and a second position of a next most recent string hashing to the hash value, means for retrieving the most recent string hashing to the hash value from memory based on the first position, means for determining a first match length between the string to be matched and the most recent string hashing to the hash value, means for retrieving the next recent string hashing to the hash value from memory based on the second position, and means for determining a second match length between the string to be matched and the next most recent string hashing to the hash value.

According to an example implementation, a computing system may include means for retrieving a plurality of positions as a single contiguous block of memory, the single contiguous block of memory being identified based on a hash value of a string to be matched, the plurality of positions referencing strings that hash to the hash value of the string to be matched and are non-contiguous, means for sequentially retrieving strings addressed by the plurality of positions and determining match lengths of the string to be matched to the retrieved strings, and means for encoding the string to be matched by a reference to a longest matching string from the sequentially retrieved strings.

The details of one or more implementations are set forth in the accompanying drawings and the description below. Other features will be apparent from the description and drawings, and from the claims.

BRIEF DESCRIPTION OF THE DRAWINGS

Like reference symbols in the various drawings indicate like elements.

DETAILED DESCRIPTION

When transferring data between different computing devices, it can be useful to compress the data before transmission and then to decompress the data after transmission. By compressing the data for transmission bandwidth over a transmission network may be conserved.

In many lossless data compression techniques, backward references are used to represent data. The speed and memory use of the backward reference search directly impact the speed of these compression techniques. The quality of the backward reference search maps to the compression density. Often the techniques have a quality control parameter that directly controls the speed/quality compromise of the compression. Improving the speed of a string matching algorithm allows to the user to choose a higher quality.

Figure 1:
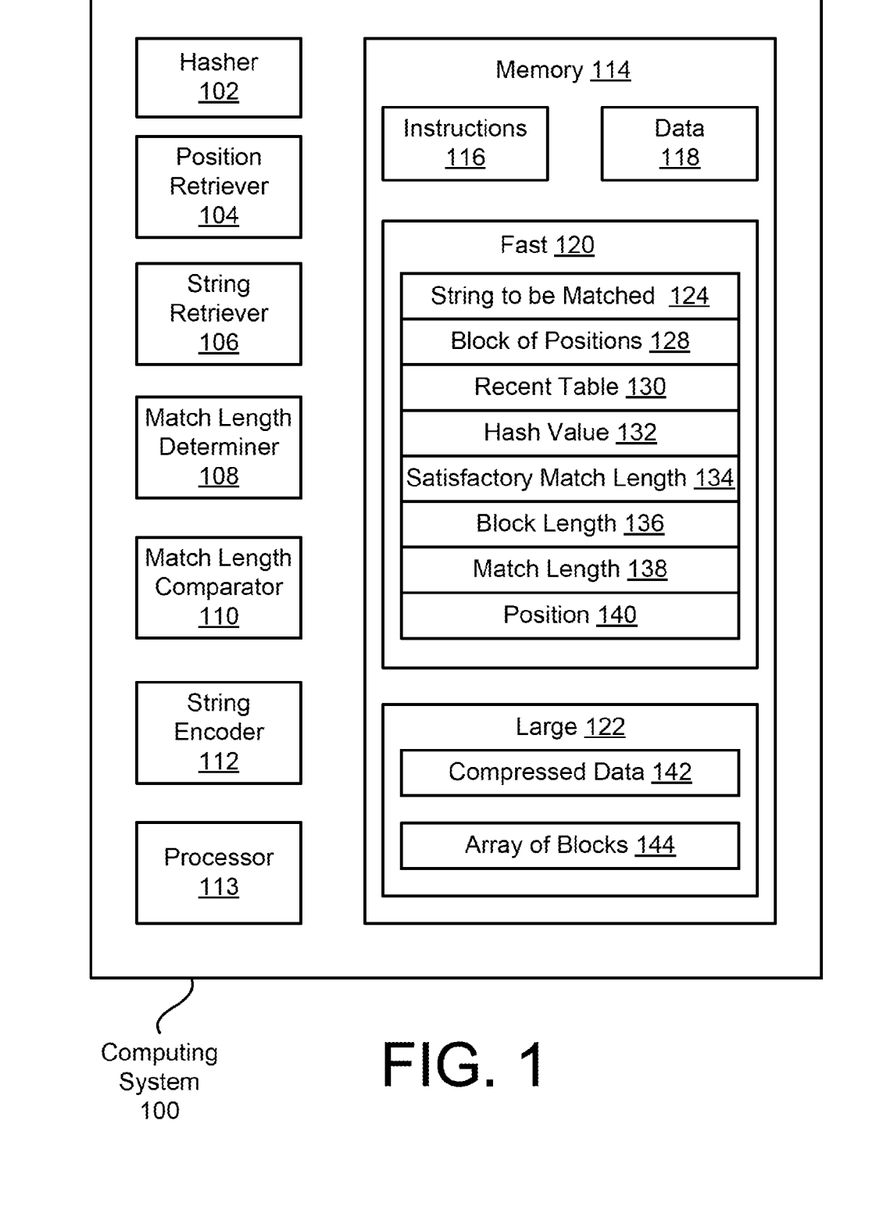
FIG. 1 is a block diagram of a computing system for compressing data by referencing previous strings for which the locations are stored in a ring buffer and/or a single contiguous block of memory according to an example implementation.

FIG. 1 is a block diagram of a computing system 100 for compressing data by referencing previous strings for which the locations are stored in a ring buffer and/or a single contiguous block of memory according to an example implementation. The computing system 100 may compress data by encoding strings as references to preceding strings that match the strings to be encoded, which may be considered a string to be matched 124. The preceding strings may be included in already compressed data 142. The references to preceding strings may include a location and/or position 140 of the matching string, such as a distance from the current string and/or string to be matched 124, and a length 138 of the match.

To reduce the time required to find potentially matching strings, the computing system 100 may store locations of previously encoded strings within the compressed data 142 with a same first n symbols, or for which the first n symbols hash to a same value 132. Hashing may be a mathematical function performed on sequences of symbols, such as bits that represent characters, that generates values unlikely to be repeated for different sequences of symbols. In example implementations, n may be a number greater than one, such as three or four, meaning that a hash function is performed on the first three or four symbols or characters of the string to determine a location at which potentially matching strings are stored. Storing the locations based on hash values of the first n characters, rather than using unique locations for every possible combination of symbols, may reduce the memory required to store the locations, as discussed below. If a sufficiently large and fast memory were available, the locations of preceding strings could be stored based on the first n symbols without performing a hash function, increasing the required memory but reducing processing time by obviating the need to perform the hash function and reducing the number of mismatches.

In the example shown in FIG. 1, the computing system 100 may include a hasher 102. The hasher 102 may perform a hash function and/or a hash operation on the first n symbols of the string to be matched 124. The computing system 100 may obtain a hash value 132 of the string to be matched 124 based on the hasher 102 performing the hash function and/or the hash operation on the string to be matched 124.

The computing system 100 may include a position retriever 104. The position retriever 104 may retrieve positions of previously encoded strings within the compressed data 142 that may match the string to be matched 124. The previously encoded strings may have a same first n symbols as the string to be matched 124, and/or may have a same hash value 132 for the first n symbols as the string to be matched, as determined by the hasher 102. The positions of the previously encoded strings may include addresses (such as thirty-two bit addresses or sixty-four bit addresses) of the previously encoded strings in memory, distances of the previously encoded strings from a string to be matched, or locations of the previously encoded strings within a data stream, such as a distance from a beginning of the data stream.

Based on the hash value 132, the position retriever 104 may retrieve an address of a block of positions 128 based on the hash value 132. The hash value 132 may directly address a memory location of the block of addresses 128. The hash value 132 may, for example, have a range based on, or equal to a range of the addresses of the blocks of addresses. The hash value 132 may, for example, be determined by a modulo operation with the range of addresses and an addition of a base value of a beginning address at which the blocks of addresses begin. In a virtual memory scheme, a translation-lookaside buffer (TLB) may map contiguous addresses of the blocks of memory in a virtual address space to noncontiguous addresses of the blocks of memory in a physical address space. In another example embodiment, the computing system 100 may include a hash table. In this example, the position retrieve 104 may retrieve the block of addresses 128 from a hash table based on the hash value 132. The hash table may store positions of the blocks of addresses.

The blocks of addresses, and/or ring buffers, may store positions of previously encoded strings which hash to the same hash value 132 as the string to be matched 124. Based on the retrieved address of the block of positions 128 (which may be determined either directly from the hash value 132 or from a hash table), the position retriever 104 may retrieve the block of positions 128 from an array of blocks 144. The block of positions 128 may include a contiguous chunk of physical memory, increasing the speed of access of the block of positions 128. The array of blocks 144 may include multiple blocks of positions and/or ring buffers. The blocks of positions and/or ring buffers included in the array of blocks 144 may be noncontiguous with each other in physical memory, and/or stored in disparate portions of memory 114. The block of positions 128 may include positions of strings, which may be the addresses and/or locations of the most recent k strings, with k corresponding to a block length 136 of the block of positions 128, which hash to the hash value 132. The block of positions 128 may be a ring buffer, storing the positions of strings which hash to the hash value 132 from most recent to least recent. In an example implementation, the positions retriever 104 may also retrieve, from a recent table 130, an index into the block of positions 128 of the most recent string which hashes to the same value as the hash value 132 of the string to be matched 124.

The computing system 100 may include a string retriever 106. The string retriever 106 may retrieve a most recent string, or in subsequent match checks, a next most recent string, from the compressed data 142 hashing to the same hash value 132 as the string to be matched 124 based on the position stored in the block of positions 128.

The computing system 100 may include a match length determiner 108. The match length determiner 108 may determine a match length 138 of the currently retrieved string to the string to be matched 124. The match length determiner 108 may determine the match length 138 by comparing each symbol and/or character of the current, previously encoded, string, to the string to be matched 124, starting with the first symbol and/or character of the current string and the string to be matched 124 and comparing successive symbols and/or characters until reaching a non-matching symbol and/or character.

The computing system 100 may include a match length comparator 110. The match length comparator 110 may compare the match length 138 of the current string to the longest match length of previously encoded strings. If the match length of the current string is longer than the match length of the longest match length of previously encoded strings, then the match length 138 and position 140 may be updated with the match length 138 and position 140 of the current string. In an example embodiment, the computing system 100 may have a preference for encoding the string to be matched 124 with more recent and/or closer strings, and the match length comparator 110 may determine a backward reference score of the current string. The backward reference score may result in the computing system 100 maintaining the match length 138 and position 140 of a previous, closer and/or more recent string even though the current string may have a greater match length.

The position retriever 104, string retriever 106, match length determiner 108, and/or match length comparator 110 may continue retrieving positions of previously encoded strings, retrieving the previously encoded strings, determining match lengths of the previously encoded strings to the string to be matched 124, and comparing the match lengths of the previously encoded strings to a longest match length, until either reaching a satisfactory match length or checking all of the strings for which positions are stored by the block of addresses 128. The position retriever 104 may retrieve a next position within the block of addresses 128 by retrieving the position within the next portion of memory within the block of positions, or, in the case of a ring buffer when reaching the end of the block of positions 128, retrieving the position at the beginning of the block of positions 128.

After at least one match has been found, the match length determiner 108 may determine match lengths of subsequent current strings by comparing symbols and/or characters of the current string and string to be matched 124 beginning at a symbol and/or character after the greatest match length, skipping a number of symbols and/or characters equal to the greatest match length. If the first symbol and/or character after the greatest match length does not match, then the computing system 100 may determine the match length of the next most recent string. If the first symbol and/or character after the greatest match length does match, then the match length determiner 108 may ensure that the first symbols and/or characters equal to the greatest match length match as well, and also determine the match length of characters and/or symbols after the greatest match length.

The computing system 100 may include a string encoder 112. The string encoder 112 may encode the string to be matched 124. If the computing system 100 found a matching previously encoded string for the string to be matched 124, and/or if the computing system 100 found a previously encoded string for which the match length 138 met or exceeded a threshold or required match length, then the string encoder 112 may encode the string to be matched 124 by a reference to the match length 138 and the position 140, which may be a distance from the string to be matched 124, of the matching string. If the computing system 100 did not find a matching previously encoded string, and/or if the greatest match did not meet or exceed the threshold or required match length, then the string encoder 112 may encode the string to be matched as a literal, such as literal bytes or according to a symbol-by-symbol or character-by-character encoding scheme, such as Huffman encoding.

The computing system 100 may include at least one processor 113. The at least one processor 113 may include a processor capable of executing instructions, such as instructions 116 stored in memory 114, to perform functions, processes, and/or methods such as the functions, processes, and/or methods described herein. The at least one processor 113 may, for example, implement the hasher 102, position retriever 104, string retriever 106, match length determiner 108, match length comparator 110, and/or string encoder 112.

The computing system 100 may include at least one memory device 114. The at least one memory device 114 may include a non-transitory computer-readable storage medium. The at least one memory device 114 may include a single memory device, or may include multiple memory devices. The at least one memory device 114 may include instructions 116 stored thereon. Instructions 116 may include instructions that may be executed by the processor 113 to cause the computing system 100 to perform any combination of the methods and/or functions described herein. The at least one memory device 114 may also store data 118. The data 118 may include any data described herein, and/or data accessed by other applications. The at least one memory device 114 may store previously encoded strings. The previously encoded strings may be referenced by position, location, and/or address, such as position with respect to and/or distance from the string to be matched 124, address within the memory 114, and/or position within the encoded data stream such as a distance from a beginning of the encoded data stream.

The memory 114 may be divided into fast memory 120 and large memory 122. The fast memory 120 may have fast access times, and/or low latency times, compared to the large memory 122, but may not be capable of storing as much data as the large memory 122. The processor 113, a memory management unit (MMU) (not shown), or another device, may move data and/or instructions from the large memory 122 to the fast memory 120, increasing speed of operations based on temporal locality, by which data is often repeatedly accessed during near periods of time. The speed of operations may also improve due to spatial locality, by which the positions and/or addresses of recent strings which hash to the same hash value 132 as the string to be matched 124 are all stored in a same block of positions 128, which may be transferred from the array of blocks 144 in the large memory 122 to the fast memory 120. The fast memory 120 may include a cache utilizing static random access memory (SRAM), and the large memory 122 may include a main memory utilizing dynamic random access memory (DRAM), as non-limiting examples. While two portions of memory, the fast memory 120 and large memory 122, are shown in FIG. 1, any number of portions of memory may be included. The fast memory 120 may be higher in the memory hierarchy of the computing system 100 than the large memory 122, and/or the fast memory 120 may have a faster access time than the large memory 122. The fast memory 120 may be in a higher level cache than the large memory 122, such as the fast memory being in L2 cache and the large memory 122 being in L3 cache, according to an example implementation.

The fast memory 120 may include the string to be matched 124. The string to be matched 124 may include a sequence of characters beginning after the last character that has been encoded, and/or after the encoded data. The string to be matched 124 may be encoded as zeroes and ones, such as according to American Standard Code for Information Interchange (ASCII), Unicode, or an entropy encoding scheme such as Huffman encoding, as non-limiting examples.

The position retriever 104 may retrieve the address of a block of addresses 128 for the recent strings which hash to the same hash value 132 as the string to be matched 124 based on the hash value.

The array of blocks 144 may include one block for each possible hash value, and each block may identify multiple, such as no more than $2^8=256$ or $2^6=64$, strings hashing to the hash value 132. In an example in which the hash function performed by the hasher 102 results in fifteen-bit values, the array of blocks 144 may include $2^{15}=32,768$ blocks of addresses and/or ring buffers. If the symbols or characters are encoded the eight-bit ASCII scheme, each entry may be shared by $2^{3*8-15}=2^{11}=2,048$ different possible combinations of characters. However, not all possible combinations of characters are equally likely to occur. The hashing function performed by the hasher 102 may be designed so that combinations of characters that are more likely to occur, and/or common symbol combinations or character combinations, hash to different values, reducing the likelihood that two different sequences of characters that actually occur in the data stream will hash to the same value and share and entry in the hash table 126 and a block in an array of blocks 144 (described below).

The fast memory 120 may store the block of addresses 128. The block of addresses 128 may have been transferred from the array of blocks 144 of the large memory 122 to the fast memory 120 based on the position retriever 104 retrieving the single contiguous block of memory including the block of positions 128, and/or the position retriever 104 retrieving the ring buffer storing the positions of previously encoded strings that hash to the same hash value 132 as the string to be matched 124. The entries in the block of positions 128 may serve as pointers, pointing to and/or storing a position of a recent string and/or substring in the block of positions 128 and/or ring buffer.

In an example embodiment, each block of positions 128 and/or ring buffer may include no more than $2^8=256$ positions, such as $2^6=64$ positions. In an example in which the block of positions includes $2^6$ positions referring to the previously encoded strings by their address in memory and the computing system uses a thirty-two bit addressing scheme, or in which the positions refer to the locations of the previously encoded strings within the data stream using thirty-two bits, the block of addresses 128 and/or ring buffer may occupy $2^{6+5}=2^{11}$ bits or 256 bytes in the fast memory 120.

The fast memory 120 may also include a recent table 130. The recent table 130 may include one entry for each possible hash value. The recent table 130 may identify and/or index a position and/or index within the ring buffer and/or block of positions 128 where the most recently encoded string hashing to the hash value 126 associated with the entry is stored, and/or identify a position within the ring buffer and/or block of positions 128 where a most recent string hashing to the hash value associated with the entry is stored.

The fast memory 120 may also include the hash value 132 of the string to be matched 124. The hash value 132 may be determined by the hasher 102.

The fast memory 120 may also store a satisfactory match length 134. The satisfactory match length 134 may be a match length of a previous string that is long enough for the computing system 100 to cease searching for a longer match, and encode the string to be matched 124 as a reference to the previously encoded string that has a match length equal to or greater than the satisfactory match length 134.

The fast memory 120 may also include a block length 136. The block length 136 may be a length of, or number of positions stored in, the block of positions 128 and/or ring buffer. The computing system 100 may check the number of positions and/or number of strings addressed, referenced, and/or identified by the block of positions 128 and/or ring buffer which the string retriever 106 retrieved and/or for which the match length determiner 108 determined a match length, and if the number of positions and/or number of strings meets or exceeds the block length 136, the string retriever 106 may stop retrieving previous strings and the string encoder 112 may encode the string to be matched as either the longest matching previous string or as a literal.

The fast memory 120 may also store the match length 138. The match length 138 may include the match length of the current previous string for which a match length is being determined, and/or a longest match length of all strings for which a match length has been determined and against which the match length of the current previous string will be compared.

The fast memory 120 may also store a position 140. The position 140 may store the address within memory 114, location or position within the encoded data stream, and/or distance from the string to be matched 124, of a previous string. The position 140 may store the address within memory 114, location or position within the encoded data stream, distance from the string to be matched 124 of a current previous string, and/or the address, location, position, or distance from the string to be matched of a previous string which had the longest match with the string to be matched 124.

The large memory 122 may store the compressed data 142. The compressed data 142 may include the data, symbols, and/or characters that were encoded and/or compressed prior to the string to be matched 124.

The large memory 122 may also store the array of blocks 144. The array of blocks 144 may include a number of blocks of positions and/or ring buffers equal to the number of possible hash values and/or equal to the number of entries in the hash table 126. The blocks of positions and/or ring buffers included in the array of blocks 144 may each be stored in contiguous chunks of physical memory, but need not be contiguous to each other in physical memory, as only a single block of positions and/or ring buffer is typically retrieved at a time.

Figure 2A:
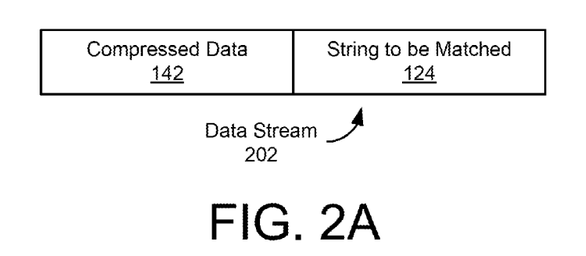
FIG. 2A is a block diagram of a data stream according to an example implementation.

FIG. 2A is a block diagram of a data stream 202 according to an example implementation. As shown in FIG. 2A, the data stream 202 may include the compressed data 142 and a string to be matched 124. The compressed data 142 may include previously encoded data, and the string to be matched 124 may include a portion of the data stream 202 beginning after the end of the compressed data 142. The string to be matched 124 may be encoded as literal bytes, or by reference to a matching string in the compressed data 142, which itself may be encoded by reference to a matching string.

Figure 2B:
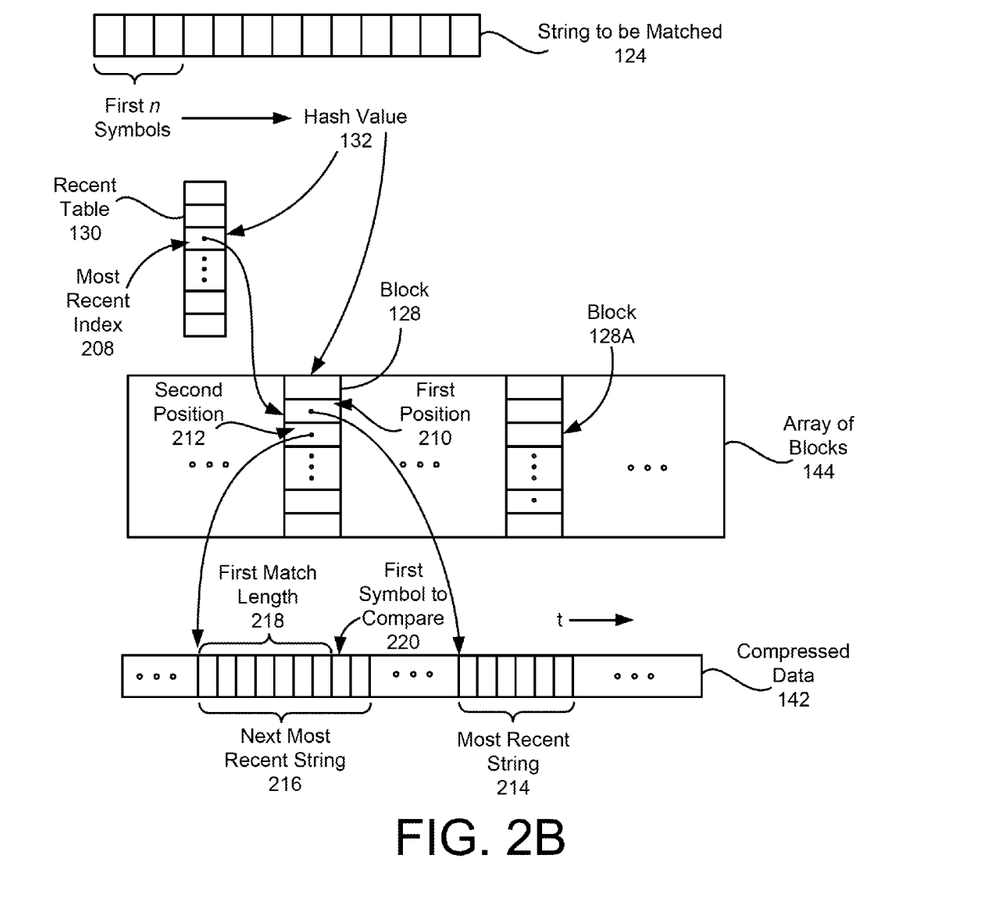
FIG. 2B is a block diagram showing a string to be matched and portions of memory used to match the string according to an example implementation.

FIG. 2B is a block diagram showing string to be matched 124 and portions of the memory 114 used to match the string 124 according to an example implementation. As discussed above, the hasher 102 may perform a hash function on the first n, such as three or four, symbols of the string to be matched 124, to determine and/or obtain the hash value 132. The position retriever 104 may use the hash value 132 as an index into the array of blocks 144 to retrieve the block of positions 128, and/or the recent table 130 to determine the most recent position within the block of positions 128 and/or ring buffer.

The block 128 in the array of blocks 144 indexed and/or addressed by the hash value 132 may include the block of positions 128, which may be a ring buffer, of previous strings that hash to the hash value 132. The entry in the recent table 130 indexed by the hash value 132 may store a most recent index 208. The most recent index 208 may identify an entry in the block 128 and/or ring buffer that stores the position of the most recent encoded string that hashes to the hash value 132.

The position of the most recent encoded string included in the block of positions 128 may be considered a first position 210, the next position of the next or second most recent encoded string included in the block of positions 128 may be considered a second position 212, and subsequent positions may be encoded subsequently. When the bottom (as shown schematically in FIG. 2B) of the block 128 and/or the entry with the highest or lowest position is reached, the position retriever 104 may continue retrieving positions starting at the top of the block 128 and/or the entry with the lowest or highest position.

The string retriever 106 may use the first position 210 stored in the block of addresses 128 and/or ring buffer to find a most recent string 214. The match length determiner 108 may determine a match length of the most recent string 214 to the string to be matched 124.

The string retriever 106 may subsequently use the second position 212 stored in the block of addresses 128 and/or ring buffer to find a next most recent string 216, and the match length determiner 108 may determine a match length of the next most recent string 216 to the string to be matched 124. The match length determiner 108 may ignore the first m symbols or characters of the next most recent string 216, m being the match length of the most recent string 214 with the string to be matched 124, and/or the length of the greatest match to the string to be matched 124. The match length determiner 108 may first compare the symbol 220 beginning after the first match length 218, and only compare the preceding symbols if the first symbol to compare 220 matches the corresponding symbol and/or character in the string to be matched 124. The match length comparator 110 may compare the match length of the next recent string 216 with the string to be matched 124 to the match length of the most recent string 214 with the string to be matched 124. The position retrievings, string retrievings, matchings, and comparisons may continue until either the satisfactory match length 134 has been reached or length determinations and comparisons have been performed for previous strings addressed, referenced, pointed to, and/or identified by all of the entries in the block 128. The string encoder 112 may then encode all or a portion of the string to be matched 124 as a literal or as a reference to a matching previously encoded string.

After the string encoder 112 has encoded the string to be matched 124, the computing system 100 may write the address, location, and/or position of the string to be matched over an oldest or least recent entry in the block 128, which may be adjacent to the first position 210 (or on an opposite end of the block 128 if the first position 210 was at a beginning or end of the block 128), and may update the most recent index 208 to indicate the entry in the block 128 in which the position of the string to be matched 124 is stored and/or where the oldest or least recent entry was written over.

The computing system 100 may then encode a next string to be matched by determining a new hash value of the next string to be matched. The new hash value may identify and/or address a new block 128A within the array of blocks 144.

Figure 3:
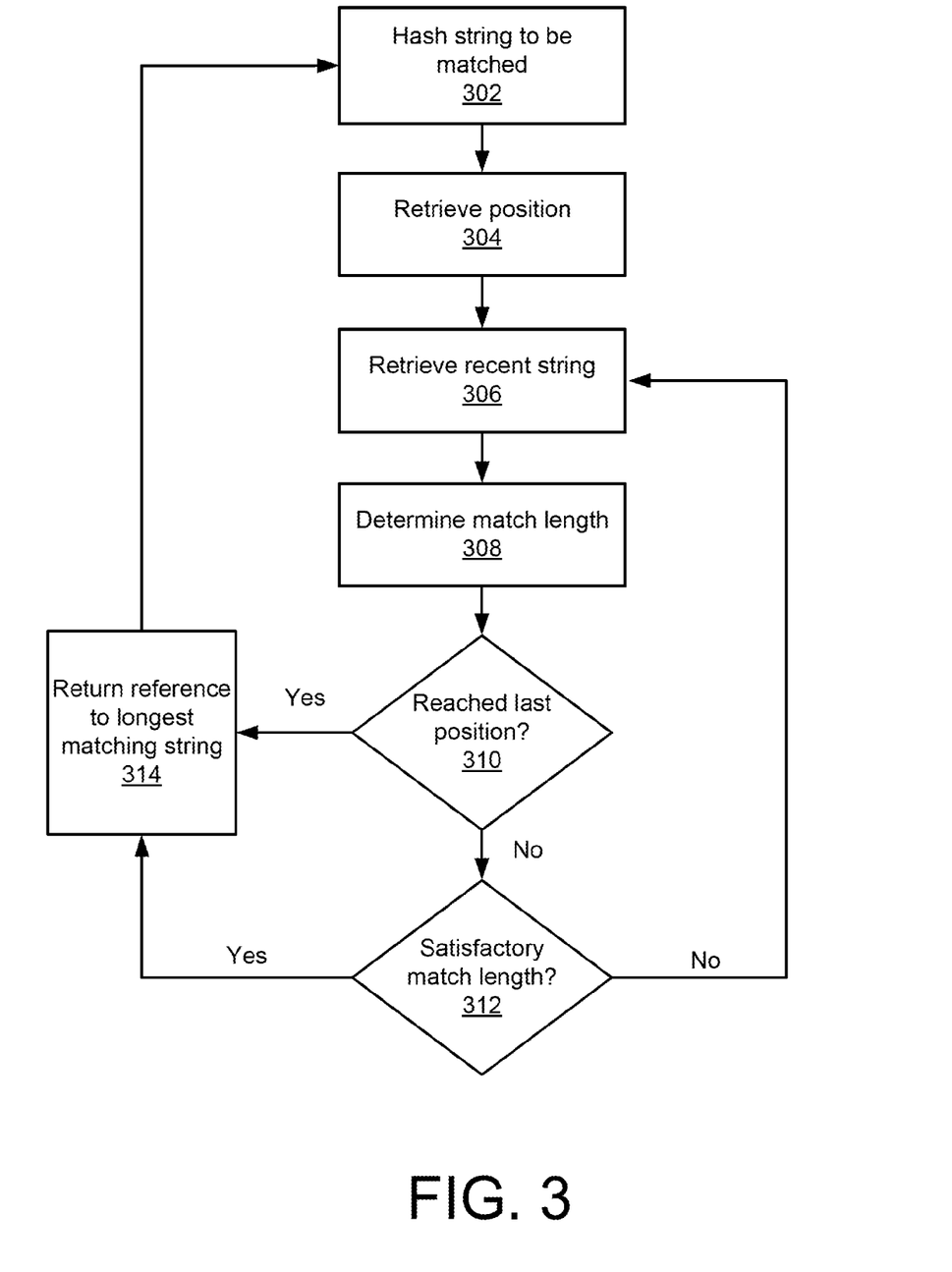
FIG. 3 is a flowchart showing functions performed to encode the string according to an example implementation.

FIG. 3 is a flowchart showing functions performed to encode the string 124 according to an example implementation. The hasher 102 may perform a hash function on the string to be matched 124 (302) to determine a hash value 132. Based on the hash value 132, the position retriever 104 may retrieve positions of strings that hash to the same hash value 132 as the string to be matched 124 (304). The position retriever 104 may, for example, retrieve a position of a block of positions 128 and/or ring buffer based on the hash value 132.

The string retriever 106 may retrieve a recent string (306), such as the most recent string 214 or next most recent string 216 shown in FIG. 2B, or other recent strings. The string retriever 106 may retrieve the recent string based on the position of the recent string stored in the block of positions 128 and/or ring buffer.

The match length determiner 108 may determine a match length of the retrieved recent string to the string to be matched (124). The computing system 100 may determine whether the string addressed, referenced by, and/or pointed to by the last position in the block 128 and/or ring buffer has been retrieved (310), or whether the string for which the match length was determined (308) has a match length meeting or exceeding the satisfactory match length 134 (312). The determination of reaching the last address (310) or meeting or exceeding the satisfactory match length (312) may be performed in any order.

If the last position was reached and/or if the match length is satisfactory, then the computing system 100 may return a reference to the longest matching string, which may include the match length 138 and position 140 of the longest matching string, and/or may encode the string to be matched 124 by a reference to the longest matching string, which may include the match length 138 and position 140 of the longest matching string. However, if the last position was reached and no matching strings were found, or if the last position was reached and no recent strings had match lengths of at least a minimum threshold, then the string to be matched 124 may be encoded as a literal. If the last position has not been reached and the match length is not satisfactory, then the computing system 100 may continue retrieving recent strings (306).

Figure 4:
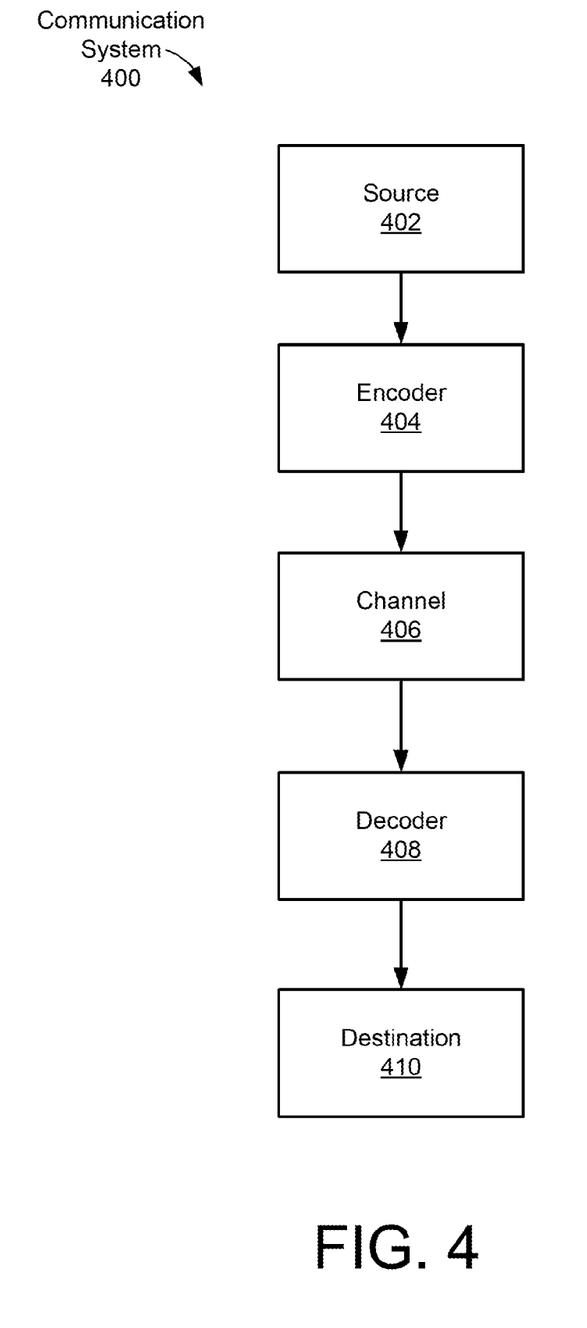
FIG. 4 is a diagram of a communication system according to an example implementation.

FIG. 4 is a diagram of a communication system 400 according to an example implementation. The communication system 400 may transmit information and/or data from a source 402 to a destination 410. The information and/or data may represent characters, such as letters, numbers, punctuations marks, and/or symbols, in any language, such as English, German, Hungarian, Arabic, and/or Chinese. The characters may be encoded into a bit-level (ones and zeroes) or other representation, with combinations of multiple bits or other symbols representing characters, and may be compressed. Compression may reduce the number of bits or other symbols needed to represent the information and/or data. The characters may be compressed according to one or more techniques described above. The information and/or data may be compressed by, for example, including references to previously encoded strings and/or data.

The system 400 may include the source 402. The source 402 may include a computing system, or a component of a computing system such as a memory or a file, which stores information or data that represent characters, such as alphanumeric characters, punctuation marks, or characters or symbols according to any understood character system and/or language. The source 402 may, in response to an instruction or as part of an operation or function to transmit the information or data, provide the data or characters to an encoder 404.

An encoder 404 may encode the data for transmission to the destination 410 via a communication channel 406. The encoder 404, which may perform any of the functions, techniques, and/or methods described above with reference to the computing system 100 and/or any of the components of the computing system 100, may compress the data to reduce a number of bits or other symbols that are needed to transmit the data or information over the channel 406. The encoder 404 may, for example, compress the characters by encoding the characters using codewords according to a lossless compression algorithm, such as Huffman encoding, which generates a unique sequence of bits for each possible character in the data stream. The encoder 404 may also compress the data by referencing previous sequences of characters and/or words which were encoded.

Rather than repeat each character in the previously encoded word, the encoder 404 may include a reference to the previously encoded word, such as a distance from the present position in the data stream, and the length of the previously encoded word. Encoder 404 may, for example, include the distance or number of characters back from the present position and/or current character that the previously encoded word was encoded and/or began, and the length of the referenced and/or previously encoded word, or number of characters in the referenced and/or previously encoded word. The encoder 404 may store references to and/or positions or addresses of previously encoded strings, characters and/or words that hash to same values in blocks of addresses 128 and/or ring buffers as described above. The encoder 404 may encode sequences of symbols and/or characters by reference to previously encoded sequences of characters blocks of addresses 128 and/or ring buffers. The sequence of symbols and/or characters may be encoded and/or compressed. In encoded and/or compressed form, the sequence of symbols and/or characters may be represented by a first number and/or second number. The first number and/or second number may represent the length value and/or the distance value.

The encoder 404 may send the encoded data to a decoder 408 via the communication channel 406. While not shown in FIG. 1, the system 400 may also include a transmitter, which may include a modulator for modulating and/or generating the signals for transmission of the data from the encoder 404 over the channel 406, and a receiver, which may include a demodulator for demodulating and/or interpreting the signals received via the channel 406 and providing the encoded data to the decoder 408.

The system 400 may also include the decoder 408. The decoder 408 may decode the data according to an algorithm stored, understood, and/or agreed to by both the encoder 404 and the decoder 408, and/or according to an algorithm designed to decode data encoded according to the algorithm implemented by the encoder 404, such as the LZ77 algorithm. The decoder 408 may, for example, decode codewords that represent individual characters, and/or decode sequences of characters based on references to previously decoded characters. The decoder 408 may have maintained a same codebook or encoding table to decode the codewords as the encoder 404 before receiving the encoded data, or may generate the codebook or encoding table based on information received from the encoder 404, such as a map of characters to codewords or a frequency table used to generate the codebook or encoding table.

The decoder 408 may decode some characters as literals and/or codewords representing single characters, and decode some characters as members of previously decoded sequences. The encoded data may include an indicator, such as a specific sequence of bits or other symbols, indicating that subsequent bits or other symbols will refer to a previously encoded sequence of characters rather than being encoded and/or decoded as literals.

If a group, series, or sequence of bits or other symbols refers to a previously encoded/decoded word, the group, series, or sequence of bits or other symbols may include a length value and a distance value. The length value and distance value may be included in a length/distance pair. The decoder 408 may use the distance value and the length value to repeat a previously decoded string of characters. The decoder 408 may provide the decompressed and/or decoded version of the characters and/or data, which may include representations of characters including individual characters and/or repeated sequences of characters, to the destination 410, which may be a computing device such as a memory device and/or file included in a computing system that may also include the decoder 408.

Figure 5:
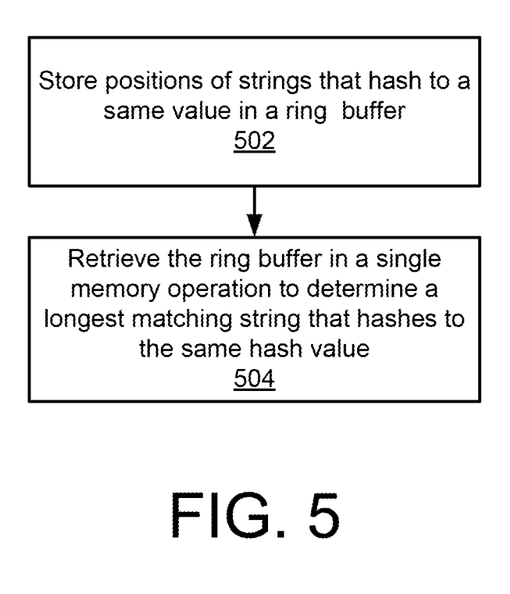
FIG. 5 is a flowchart of a method according to an example implementation.

FIG. 5 is a flowchart of a method according to an example implementation. According to this example, the method may include the computing system 100 storing positions of strings that hash to a same hash value 132 in a ring buffer (502), and the position retriever 104 retrieving the ring buffer and/or block of positions 128 in a single memory operation so that the match length determiner 108 and match length comparator 110 may determine a longest matching string that hashes to the same hash value 132 (504).

According to an example implementation, the positions of the strings may include addresses of the strings in memory 114.

According to an example implementation, the positions of the strings may include distances from a string to be matched 124.

According to an example implementation, the positions of the strings may include locations within a data stream 202.

According to an example implementation, storing the positions of the strings that hash to the same value in the ring buffer (502) may include writing a position of a new string over a position of an oldest string in the ring buffer.

According to an example implementation, storing the positions of the strings that hash to the same value in the ring buffer (502) may include maintaining a pointer, the pointer storing an index of a most recent string in the ring buffer.

According to an example implementation, the same value may include a first value and the ring buffer may a first ring buffer. The method may further include storing positions of strings that hash to a second value in a second ring buffer, and storing the first ring buffer and the second ring buffer in an array of ring buffers.

Figure 6:
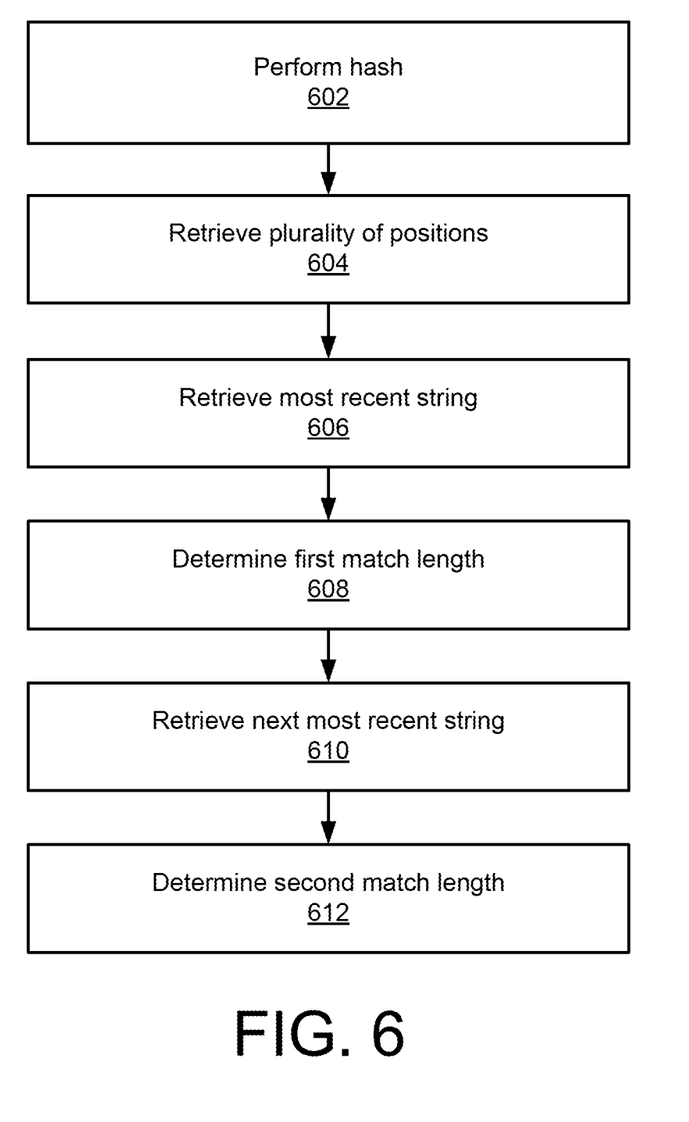
FIG. 6 is a flowchart of a method according to an example implementation.

FIG. 6 is a flowchart of a method according to an example implementation. The method may include performing a hash function on a first n symbols of a string to be matched 124 to obtain a hash value 132 (602). The method may also include retrieving a plurality of positions included in a ring buffer and/or block of positions 128 by indexing the ring buffer and/or block of positions based on the hash value 132, the plurality of positions including at least a first position 210 of a most recent string 124 hashing to the hash value and a second position 212 of a next most recent string 216 hashing to the hash value 132 (604). The method may also include retrieving the most recent 214 string hashing to the hash value 132 from memory 114 based on the first position 210 (606). The method may also include determining a first match length 218 between the string to be matched 124 and the most recent string 214 hashing to the hash value 132 (608). The method may also include retrieving the next recent string 216 hashing to the hash value 132 from memory 114 based on the second position 212 (610). The method may also include determining a second match length between the string to be matched 124 and the next most recent string 216 hashing to the hash value 132 (612).

According to an example implementation, the positions included in the ring buffer and/or block of positions 128 may include addresses of the strings in memory 114 such as in the large memory 122.

According to an example implementation, the positions included in the ring buffer and/or block of positions 128 distances from the string to be matched 124.

According to an example implementation, the positions included in the ring buffer and/or block of positions 128 may include locations within a data stream 202.

According to an example implementation, the retrieving the plurality of positions included in the ring buffer (604) may include retrieving all of the positions included in the ring buffer as a single block.

According to an example implementation, the method may further include retrieving an index within the ring buffer and/or block of positions 128 of the most recent string 214 hashing to the hash value 132.

According to an example implementation, the method may further induce, if the first match length 218 is greater than the second match length, returning the first match length as a returned match length and a position of the most recent string 214 hashing to the hash value 132, and if the second match length is greater than the first match length 218, returning the second match length as a returned match length and a position of the next most recent string 216 hashing to the hash value 132.

According to an example implementation, the method may further include encoding the string to be matched with returned match length and position.

According to an example implementation, the method may further include performing the hash function on the first n symbols of the string to be matched 124 after the returned match length.

According to an example implementation, the method may further include, if the first match length 218 is greater than or equal to the second match length, returning the first match length and a distance of the most recent string 214 hashing to the hash value 132 from the string to be matched 124, and if the second match length is greater than the first match length 218, returning the second match length and a distance of the next most recent string 216 hashing to the hash value 132 from the string to be matched 124.

According to an example implementation, the determining the second match length (612) may include ignoring a first m symbols of the next most recent string 216 hashing to the hash value 132, m being the first match length 218.

According to an example implementation, if the $(m+1)^{th}$ symbol of the next most recent string 216 matches the $(m+1)^{th}$ symbol of the string to be matched 124, the method may further include determining if the first m symbols of the next most recent string 216 match the first m symbols of the string to be matched 124.

According to an example implementation, the ring buffer and/or block of positions 128 may include 256 or fewer positions.

According to an example implementation, the ring buffer and/or block of positions 128 may include sixty-four positions.

According to an example implementation, the method may further include continuing retrieving and determining match lengths of recent strings hashing to the hash value 132 until either reaching a predetermined satisfactory match length 134 or retrieving and determining match lengths of all recent strings for which positions are included in the ring buffer and/or block of positions 128.

According to an example implementation, the method may further include updating the ring buffer and/or block of positions by writing a position of the string to be matched 124 over a position of a least recent string hashing to the hash value 132 and stored in the ring buffer and/or block of positions. According to an example implementation, the position of the least most recent string hashing to the hash value 132 may be stored in a location of the ring buffer and/or block of positions 132 either immediately before or immediately after the position 210 of the most recent string 214 hashing to the hash value 132.

According to an example implementation, the hash function may be configured to cause common symbol combinations to hash to different values.

According to an example implementation, the method may further include sending the compressed data 142 to a decoder 408.

According to an example implementation, the method may further include sending the compressed data 142 to a decoder 408 for decompression according to an LZ77 algorithm.

Figure 7:
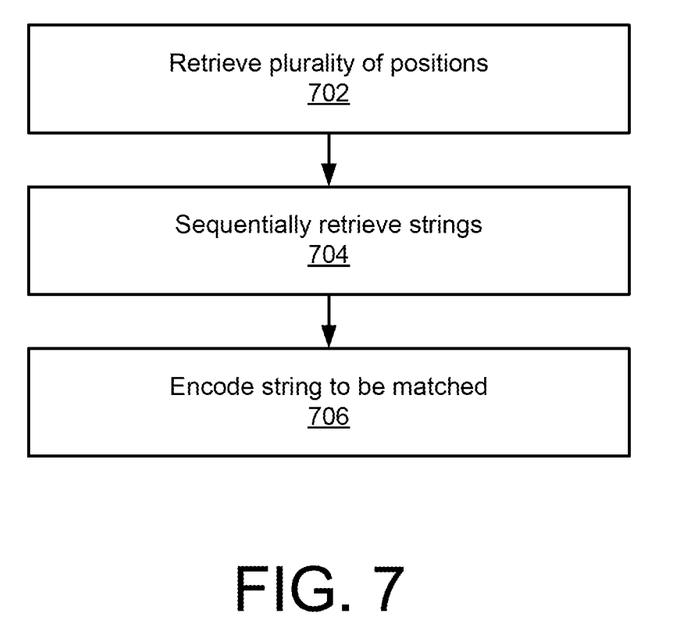
FIG. 7 is a flowchart of a method according to an example implementation.

FIG. 7 is a flowchart of a method according to an example implementation. The method may include retrieving a plurality of positions as a single contiguous block of memory, the single contiguous block of memory being identified based on a hash value 132 of a string to be matched 124, the plurality of positions referencing strings that hash to the hash value 132 of the string to be matched 124 and are non-contiguous (702). The method may also include sequentially retrieving strings (306) addressed by the plurality of positions and determining match lengths (308) of the string to be matched 124 to the retrieved strings (704). The method may also include encoding the string to be matched 124 by a reference to a longest matching string from the sequentially retrieved strings (706).

Figure 8:
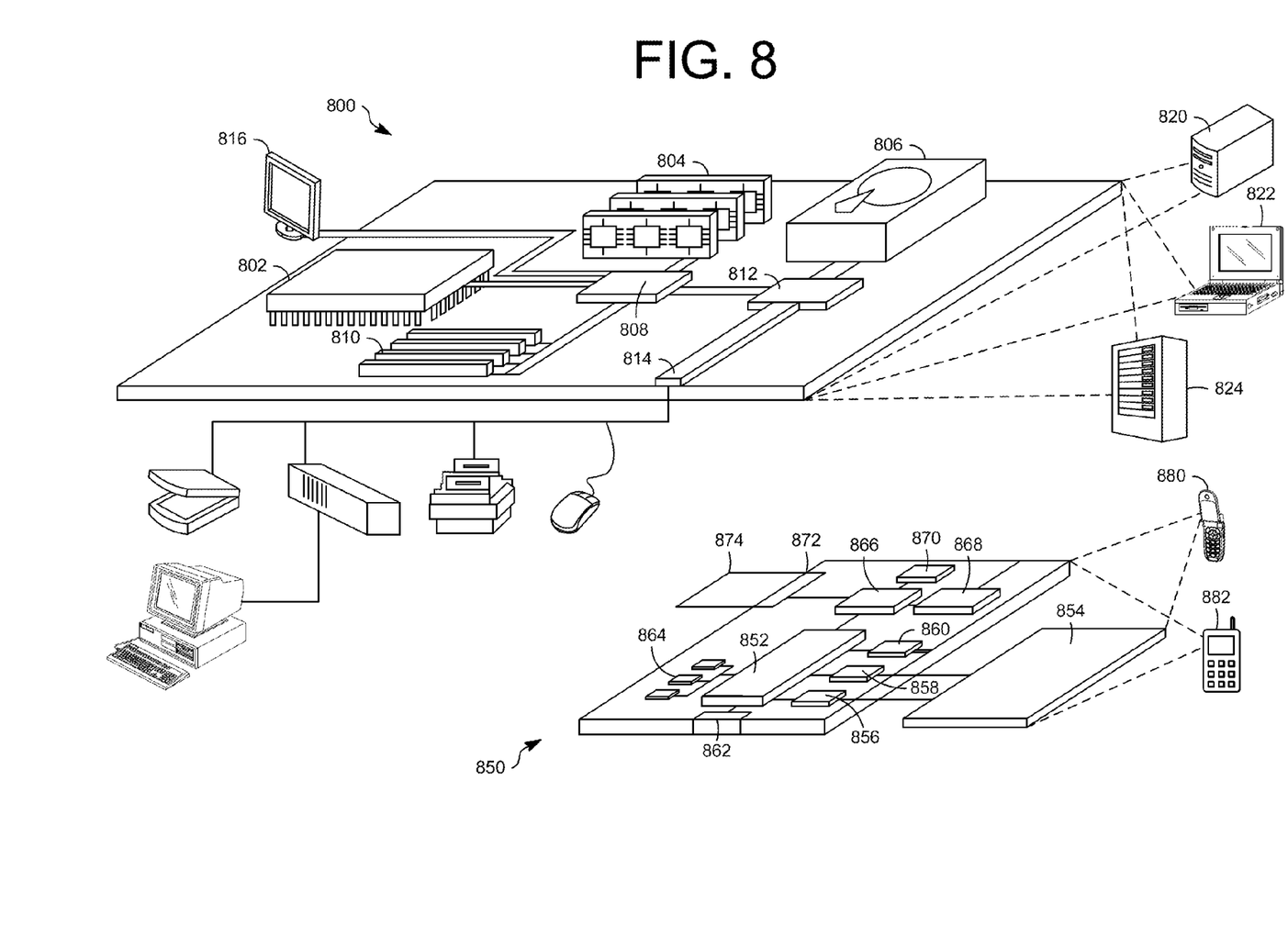
FIG. 8 shows an example of a computer device and a mobile computer device that can be used to implement the techniques described here.

FIG. 8 shows an example of a generic computer device 800 and a generic mobile computer device 850, which may be used with the techniques described here. Computing device 800 is intended to represent various forms of digital computers, such as laptops, desktops, workstations, personal digital assistants, servers, blade servers, mainframes, and other appropriate computers. Computing device 850 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 800 includes a processor 802, memory 804, a storage device 806, a high-speed interface 808 connecting to memory 804 and high-speed expansion ports 810, and a low speed interface 812 connecting to low speed bus 814 and storage device 806. Each of the components 802, 804, 806, 808, 810, and 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as display 816 coupled to high speed interface 808. In other implementations, multiple processors and/or multiple buses may be used, as appropriate, along with multiple memories and types of memory. Also, multiple computing devices 800 may be connected, with each device providing portions of the necessary operations (e.g., as a server bank, a group of blade servers, or a multi-processor system).

The memory 804 stores information within the computing device 800. In one implementation, the memory 804 is a volatile memory unit or units. In another implementation, the memory 804 is a non-volatile memory unit or units. The memory 804 may also be another form of computer-readable medium, such as a magnetic or optical disk.

The storage device 806 is capable of providing mass storage for the computing device 800. In one implementation, the storage device 806 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 804, the storage device 806, or memory on processor 802.

The high speed controller 808 manages bandwidth-intensive operations for the computing device 800, while the low speed controller 812 manages lower bandwidth-intensive operations. Such allocation of functions is exemplary only. In one implementation, the high-speed controller 808 is coupled to memory 804, display 816 (e.g., through a graphics processor or accelerator), and to high-speed expansion ports 810, which may accept various expansion cards (not shown). In the implementation, low-speed controller 812 is coupled to storage device 806 and low-speed expansion port 814. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. It may also be implemented as part of a rack server system 824. In addition, it may be implemented in a personal computer such as a laptop computer 822. Alternatively, components from computing device 800 may be combined with other components in a mobile device (not shown), such as device 850. Each of such devices may contain one or more of computing device 800, 850, and an entire system may be made up of multiple computing devices 800, 850 communicating with each other.

Computing device 850 includes a processor 852, memory 864, an input/output device such as a display 854, a communication interface 866, and a transceiver 868, among other components. The device 850 may also be provided with a storage device, such as a microdrive or other device, to provide additional storage. Each of the components 850, 852, 864, 854, 866, and 868, are interconnected using various buses, and several of the components may be mounted on a common motherboard or in other manners as appropriate.

The processor 852 can execute instructions within the computing device 850, including instructions stored in the memory 864. The processor may be implemented as a chipset of chips that include separate and multiple analog and digital processors. The processor may provide, for example, for coordination of the other components of the device 850, such as control of user interfaces, applications run by device 850, and wireless communication by device 850.

Processor 852 may communicate with a user through control interface 858 and display interface 856 coupled to a display 854. The display 854 may be, for example, a TFT LCD (Thin-Film-Transistor Liquid Crystal Display) or an OLED (Organic Light Emitting Diode) display, or other appropriate display technology. The display interface 856 may comprise appropriate circuitry for driving the display 854 to present graphical and other information to a user. The control interface 858 may receive commands from a user and convert them for submission to the processor 852. In addition, an external interface 862 may be provide in communication with processor 852, so as to enable near area communication of device 850 with other devices. External interface 862 may provide, for example, for wired communication in some implementations, or for wireless communication in other implementations, and multiple interfaces may also be used.

The memory 864 stores information within the computing device 850. The memory 864 can be implemented as one or more of a computer-readable medium or media, a volatile memory unit or units, or a non-volatile memory unit or units. Expansion memory 874 may also be provided and connected to device 850 through expansion interface 872, which may include, for example, a SIMM (Single In Line Memory Module) card interface. Such expansion memory 874 may provide extra storage space for device 850, or may also store applications or other information for device 850. Specifically, expansion memory 874 may include instructions to carry out or supplement the processes described above, and may include secure information also. Thus, for example, expansion memory 874 may be provide as a security module for device 850, and may be programmed with instructions that permit secure use of device 850. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 864, expansion memory 874, or memory on processor 852, that may be received, for example, over transceiver 868 or external interface 862.

Device 850 may communicate wirelessly through communication interface 866, which may include digital signal processing circuitry where necessary. Communication interface 866 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 868. In addition, short-range communication may occur, such as using a Bluetooth, WiFi, or other such transceiver (not shown). In addition, GPS (Global Positioning System) receiver module 870 may provide additional navigation- and location-related wireless data to device 850, which may be used as appropriate by applications running on device 850.

Device 850 may also communicate audibly using audio codec 860, which may receive spoken information from a user and convert it to usable digital information. Audio codec 860 may likewise generate audible sound for a user, such as through a speaker, e.g., in a handset of device 850. Such sound may include sound from voice telephone calls, may include recorded sound (e.g., voice messages, music files, etc.) and may also include sound generated by applications operating on device 850.

The computing device 850 may be implemented in a number of different forms, as shown in the figure. For example, it may be implemented as a cellular telephone 880. It may also be implemented as part of a smart phone 882, personal digital assistant, or other similar mobile device.

Implementations of the various techniques described herein may be implemented in digital electronic circuitry, or in computer hardware, firmware, software, or in combinations of them. Implementations may implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT) or liquid crystal display (LCD) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. A non-transitory computer-readable storage medium comprising instructions stored thereon that, when executed by at least one processor, are configured to cause a computing system to compress data by:
   storing positions of strings that hash to a hash value in a ring buffer;
   retrieving the ring buffer in a single memory operation based on the hash value;
   determining, for a string to be matched, a longest matching string that hashes to the hash value of the string to be matched by determining match lengths of strings for which the positions are stored in the ring buffer; and
   encoding the string to be matched by a reference to the longest matching string.

2. The non-transitory computer-readable storage medium of claim 1, wherein the positions of the strings include addresses of the strings in memory.

3. The non-transitory computer-readable storage medium of claim 1, wherein the positions of the strings include distances from the string to be matched.

4. The non-transitory computer-readable storage medium of claim 1, wherein the positions of the strings include locations within a data stream.

5. The non-transitory computer-readable storage medium of claim 1, wherein storing the positions of the strings that hash to the hash value in the ring buffer includes writing a position of a new string over a position of an oldest string in the ring buffer.

6. The non-transitory computer-readable storage medium of claim 1, wherein storing the positions of the strings that hash to the hash value in the ring buffer includes maintaining a pointer, the pointer storing an index to a position in the ring buffer that stores a position of a most recent string that hashes to the hash value.

7. The non-transitory computer-readable storage medium of claim 1, wherein:
   the hash value includes a first hash value and the ring buffer includes a first ring buffer; and
   the instructions, when executed by the at least one processor, are further configured to cause the computing system to:
      store positions of strings that hash to a second hash value in a second ring buffer; and
      store the first ring buffer and the second ring buffer in an array of ring buffers.

8. A non-transitory computer-readable storage medium comprising instructions stored thereon that, when executed by at least one processor, are configured to cause a computing system to compress data by:
   performing a hash function on a first n symbols of a string to be matched to obtain a hash value;
   retrieving a plurality of positions included in a ring buffer by indexing the ring buffer based on the hash value, the plurality of positions including at least a first address identifying a first position in a memory of a most recent string hashing to the hash value and a second address identifying a second position in the memory of a next most recent string hashing to the hash value;
   retrieving the most recent string hashing to the hash value from the first position in the memory;
   determining a first match length between the string to be matched and the most recent string hashing to the hash value;
   retrieving the next recent string hashing to the hash value from the second position in the memory;
   determining a second match length between the string to be matched and the next most recent string hashing to the hash value; and
   encoding the string to be matched by a reference to, based whether the first match length is greater than the second match length, either the most recent string hashing to the hash value or the second most recent string hashing to the hash value.

9. The non-transitory computer-readable storage medium of claim 8, wherein the positions included in the ring buffer include addresses of the strings in memory.

10. The non-transitory computer-readable storage medium of claim 8, wherein the positions in the memory included in the ring buffer include distances from the string to be matched.

11. The non-transitory computer-readable storage medium of claim 8, wherein the positions in the memory included in the ring buffer include locations within a data stream.

12. The non-transitory computer-readable storage medium of claim 8, wherein the retrieving the plurality of positions included in the ring buffer includes retrieving all of the positions included in the ring buffer as a single block.

13. The non-transitory computer-readable storage medium of claim 8, wherein the instructions are further configured to cause the computing system to retrieve an index within the ring buffer, the index identifying a location in the ring buffer that stores an address in memory of the most recent string hashing to the hash value.

14. The non-transitory computer-readable storage medium of claim 8, wherein the instructions are further configured to cause the computing system to:
   if the first match length is greater than the second match length, return the first match length as a returned match length and a position of the most recent string hashing to the hash value; and
   if the second match length is greater than the first match length, return the second match length as a returned match length and a position of the next most recent string hashing to the hash value.

15. The non-transitory computer-readable storage medium of claim 14, wherein the instructions are further configured to cause the computing system to encode the string to be matched with the returned match length and position.

16. The non-transitory computer-readable storage medium of claim 14, wherein the instructions are further configured to cause the computing system to perform the hash function on the first n symbols of the string to be matched after the returned match length.

17. The non-transitory computer-readable storage medium of claim 8, wherein the instructions are further configured to cause the computing system to:
   if the first match length is greater than or equal to the second match length, return the first match length and a distance of the most recent string hashing to the hash value from the string to be matched; and
   if the second match length is greater than the first match length, return the second match length and a distance of the next most recent string hashing to the hash value from the string to be matched.

18. The non-transitory computer-readable storage medium of claim 8, wherein the determining the second match length includes ignoring a first m symbols of the next most recent string hashing to the hash value, m being the first match length.

19. The non-transitory computer-readable storage medium of claim 18, wherein, if an $(m+1)^{th}$ symbol of the next most recent string matches an $(m+1)^{th}$ symbol of the string to be matched, the instructions are further configured to cause the computing system to determine if the first m symbols of the next most recent string match the first m symbols of the string to be matched.

20. The non-transitory computer-readable storage medium of claim 8, wherein the ring buffer includes 256 or fewer positions.

21. The non-transitory computer-readable storage medium of claim 8, wherein the ring buffer includes sixty-four positions.

22. The non-transitory computer-readable storage medium of claim 8, wherein the instructions are further configured to cause the computing system to continue retrieving and determining match lengths of recent strings hashing to the hash value until either reaching a predetermined satisfactory match length or retrieving and determining match lengths of all recent strings for which positions are included in the ring buffer.

23. The non-transitory computer-readable storage medium of claim 8, wherein the instructions are further configured to cause the computing system to update the ring buffer by writing a position of the string to be matched over a position of a least recent string hashing to the hash value and stored in the ring buffer.

24. The non-transitory computer-readable storage medium of claim 23, wherein the position of the least most recent string hashing to the hash value is stored in a location of the ring buffer either immediately before or immediately after the position of the most recent string hashing to the hash value.

25. The non-transitory computer-readable storage medium of claim 8, wherein the hash function is configured to cause common symbol combinations to hash to different values.

26. The non-transitory computer-readable storage medium of claim 8, wherein the instructions are further configured to cause the computing system to send the compressed data, including the encoded string to be matched, to a decoder.

27. The non-transitory computer-readable storage medium of claim 8, wherein the instructions are further configured to cause the computing system to send the compressed data, including the encoded string to be matched, to a decoder for decompression according to an LZ77 algorithm.

28. A non-transitory computer-readable storage medium comprising instructions stored thereon that, when executed by at least one processor, are configured to cause a computing system to at least:

retrieve a plurality of positions as a single contiguous block of memory, the single contiguous block of memory being identified based on a hash value of a string to be matched, the plurality of positions referencing addresses of strings that hash to the hash value of the string to be matched and are non-contiguous;

sequentially retrieve strings addressed by the plurality of positions and determine match lengths of the string to be matched to the retrieved strings; and encode the string to be matched by a reference to a longest matching string from the sequentially retrieved strings.

* * * * *